United States Patent [19]

Umaba

[11] Patent Number: 5,373,786
[45] Date of Patent: Dec. 20, 1994

[54] METAL MASK PLATE FOR SCREEN PRINTING

[75] Inventor: Takayuki Umaba, Kyoto, Japan

[73] Assignee: Dainippon Screen Mfg. Co., Ltd., Japan

[21] Appl. No.: 71,779

[22] Filed: Jun. 4, 1993

[30] Foreign Application Priority Data

Jun. 10, 1992 [JP] Japan ............... 4-177381

[51] Int. Cl.$^5$ ............... B05C 17/06
[52] U.S. Cl. ............... 101/127; 101/114
[58] Field of Search ............... 101/127, 114, 128.4, 101/178.21, 129; 427/143, 282; 118/501, 504

[56] References Cited

U.S. PATENT DOCUMENTS

| | | | |
|---|---|---|---|
| 3,194,153 | 7/1965 | Rogerson | 101/128.2 |
| 4,242,401 | 12/1980 | Mitani et al. | 101/127 |
| 4,379,737 | 4/1983 | Mearig | 101/128.4 |
| 4,953,460 | 9/1990 | Wojcik | 101/127 |
| 5,105,551 | 4/1992 | McCutchen | 101/127 |
| 5,240,816 | 8/1993 | Noguchi et al. | 101/128.4 |

FOREIGN PATENT DOCUMENTS

| | | | |
|---|---|---|---|
| 0303737 | 12/1988 | Japan | 101/127 |
| 0075192 | 3/1991 | Japan | 101/127 |

*Primary Examiner*—Edgar S. Burr
*Assistant Examiner*—Anthony H. Nguyen
*Attorney, Agent, or Firm*—Ostrolenk, Faber, Gerb & Soffen

[57] ABSTRACT

A screen printing plate includes a plate body having a front surface and a rear surface. The plate body has a plurality of openings penetrating from the front surface to the rear surface and formed according to a preselected pattern. A recess is formed on the rear surface of the plate body so as to surround the opening. A separation wall defining the boundary of the opening and the recess is formed between this one opening and the recess. The spreading of the solder paste onto a surface to be printed around the opening and onto the rear surface of the printing plate is restricted by the recess when the paste is transferred onto the surface to be printed from the opening. The paste does not go beyond the boundary defined by the edge on the side of the recess.

18 Claims, 5 Drawing Sheets

FIG./ PRIOR ART
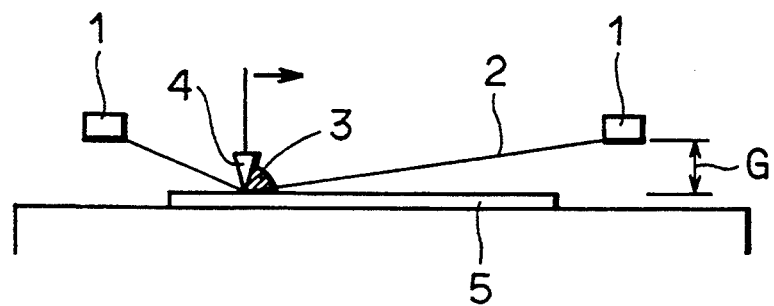
FIG.2 PRIOR ART
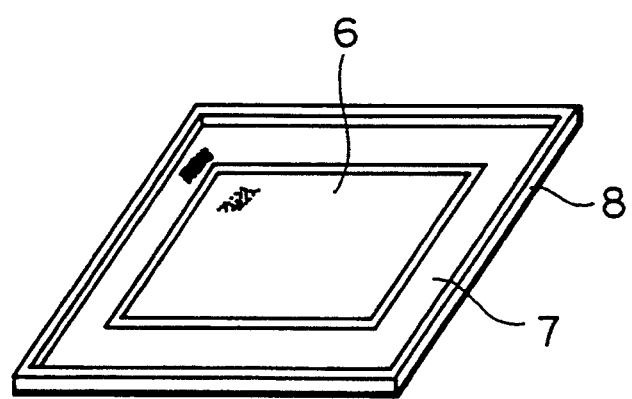

METAL MASK PLATE FOR SCREEN PRINTING

BACKGROUND OF THE INVENTION

1. Field of the Invention

The present invention relates generally to screen printing techniques, and more specifically, to a metal mask plate used for forming a film of a desired pattern on a surface of a printed board or a semiconductor substrate by screen printing.

2. Description of the Related Art

More and more chip parts are employed as electronic parts mounted, for example, on printed boards having interconnection patterns formed thereon, for the purpose of achieving high performance by increasing integration density in installation, reducing weight and size, and removing lead wires. The chip parts themselves tend to be reduced in size.

Generally, prior to installation of chip parts onto a printed board, solder paste (cream solder formed by kneading fine particles of solder, binder, solution etc. into paste) is applied and stuck to desired parts of a surface of a printed board by means of screen printing or other methods.

Screen printing will be described briefly hereinafter. Screen printing, as illustrated in FIG. 1, uses a printing plate 2 attached to a screen frame 1 under prescribed tension. Ink 3 is applied onto printing plate 2. A material to be printed 5 is placed under printing plate 2 with a gap G therebetween. A squeegee 4 is pressed against the top surface of printing plates 2 and slides thereon, and printing plate 2 is pressed into contact with the material 5. While the printing surface is in contact with the surface of material 5, squeegee 4 is moved in the direction of arrow. Thus, the ink 3 is squeezed out onto the bottom surface of printing plate 2 through openings formed in printing plate 2 to be transferred onto the material 5, and a desired pattern is formed on the surface of the material 5.

A screen printing plate used for applying solder paste to desired parts of a surface of a printed board is generally produced as follows. A metal thin plate is etched utilizing a mask according to a desired pattern. A metal mask is obtained which has a printing pattern corresponding to the above-described desired parts formed of openings penetrating in the thicknesswise direction of the thin metal plate, and the non-opening part. The metal mask will be referred to as a patterned member. As illustrated in FIG. 2, metal mask 6 is joined to a combination member 7 formed of an elastic material such as synthetic fiber mesh, and the circumference of combination member 7 is fixed to a screen frame 8 to produce a screen printing plate. A solder paste film applied by utilizing such a screen printing plate is formed according to a commonly known screen printing technique as described above.

More specifically, application of solder paste to desired parts of a surface of a printed board by the above-described screen printing technique will be described. As illustrated in FIG. 3, solder paste 11 is placed on a metal mask plate 9 having openings 10 formed according to a pattern. Metal mask plate 9 is lowered by a squeegee 12 into contact with the surface of a printed board 13 which is a material to be printed. While metal mask plate 9 is in contact with printed board 13, squeegee 12 is made to slide across mask plate 9 in the direction indicated by the arrow. With the traveling of squeegee 12, the solder paste 11 is squeezed out to the bottom surface of metal mask 9 through the openings 10 of metal mask plate 9. The solder paste is transferred onto the surface of printed board 13 and a solder film is formed according to a desired pattern.

However, when the solder paste 11 is squeezed out to the bottom or rear surface side of metal mask plate 9 through opening 10, part of the solder paste moves to the rear surface side (the surface in contact with the surface to be printed) from the opening 10 of metal mask plate 9. As illustrated in FIG. 4, paste oozes from the edge of opening 10. Therefore, when the solder paste 11 is transferred onto the surface of printed board 13 through the openings 10 of metal mask plate 9, unnecessary paste 16 disadvantageously sticks to the circumference edge of the transferred paste 15 of the printed board surface.

This phenomenon is generally encountered when screen printing is performed utilizing such a metal mask plate 9. This phenomenon is one of the things which have to be especially taken care of in screen printing utilizing a metal mask plate. This restricts the number of substrates which can be screen-printed successively without washing the rear surface side of the metal mask plate. The metal mask plate must be washed every prescribed number of printings, and therefore work efficiency is poor.

One possible solution to this disadvantage is to change the fluidity of paste in order to restrain the solder paste from moving into the rear surface side of the metal mask plate to the utmost. For example, the use of highly viscous solder paste is considered. However, this makes it difficult for the solder paste to pass through the opening of the metal mask plate. It is particularly difficult to print fine patterns according to this method.

Furthermore, the amount of paste oozed from the edge of the opening of the metal mask plate is not constant. It is therefore not easy to set conditions for printing.

SUMMARY OF THE INVENTION

It is therefore an object of the invention to provide a screen printing plate increasing work efficiency while maintaining printing quality.

Another object of the invention is to provide a screen printing plate permitting successive printing an increased number of times, while maintaining printing quality.

Yet another object of the invention is to provide a screen printing plate permitting use of a low viscosity material for application, while maintaining printing quality.

A still further object of the invention is to provide a screen printing plate permitting use of a low viscosity material for application and easy setting of conditions for printing for maintaining printing quality.

A still further object of the invention is to provide a screen printing plate permitting use of a low viscosity material for application and restraining to the utmost the material to be applied in printing from oozing onto a material to be printed.

An additional object of the invention is to provide a screen printing plate permitting use of a low viscosity material for application and restraining the oozing of the material for application onto a surface to be printed at a constant level in printing.

A screen printing plate according to the invention includes a plate body having a front surface and a rear surface. The plate body has a plurality of openings penetrating from the front surface to the rear surface and formed according to a preselected pattern. A recess is formed surrounding one opening on the rear surface of the plate body. A separation wall defining the boundary of the opening and the recess is formed between them. The spreading of the fluid material for application onto a surface to be printed around the opening or onto the rear surface of the printing plate is restricted by the recess when the material for application is transferred onto the surface to be printed from the opening. The material for application does not spread beyond the boundary defined by the edge on the side of the recess of the separation wall. Even if a material for application having a low viscosity is used, its oozing outside the printing pattern can be restrained, so that printing quality can be improved. Since a material for application having a low viscosity can be used, high quality printing of fine patterns can be performed. The number of consecutive printings without cleaning the rear surface of the printing plate is increased while printing efficiency can be improved. Furthermore, since the amount of the material for application oozing outside the printing pattern is made constant, various conditions for printing can readily be set.

According to another aspect of the invention, the recess may be formed to surround the region on the rear surface of the plate body in which the plurality of openings are formed. The plurality of openings surrounded by the recess are separated from the recess by the separation wall formed around the region in which they are formed. Furthermore, the screen printing plate may include a mesh member joined to the plate body at the front surface of the plate body and having a plurality of openings.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a front view for use in schematic illustration of a prior art screen printing process;

FIG. 2 is a perspective view showing one example of the structure of a conventional screen printing plate;

DESCRIPTION OF THE PREFERRED EMBODIMENTS

Now, preferred embodiments of the invention will be described in conjunction with the accompanying drawings.

Figure 5:
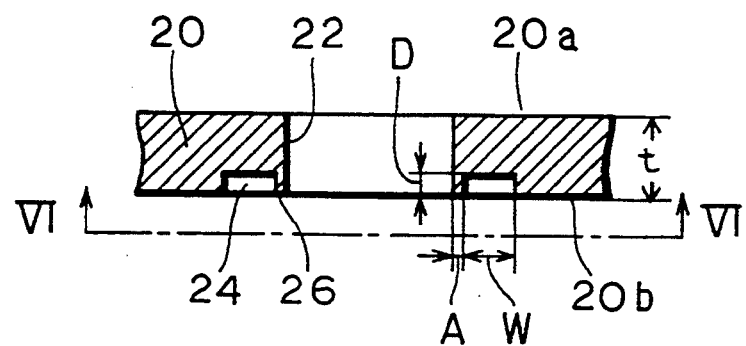
FIG. 5 is a partially enlarged vertical sectional view showing a metal mask plate constructed according to a first embodiment of the invention.
Figure 6:
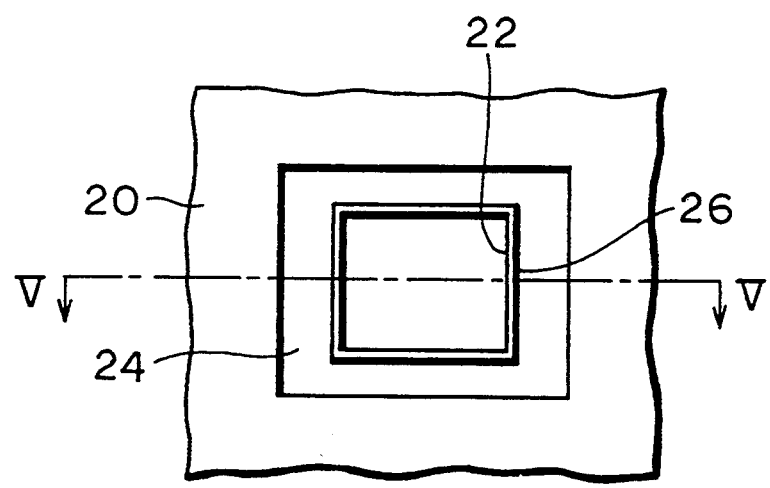
FIG. 6 is a plan view showing the metal mask plate in FIG. 5 viewed along line VI—VI from the side of a surface to be printed.

Referring to FIGS. 5 and 6, a metal mask plate for screen printing 20 constructed according to one embodiment of the invention has a front surface 20a and a rear surface 20b. Metal mask plate 20 has a plurality of openings 22 formed according to a pattern by etching. FIGS. 5 and 6 show a single simple pattern for the ease of description. Each opening 22 penetrates metal mask plate 20 in the thicknesswise direction, from front surface 20a to rear surface 20b.

A groove 24 is formed entirely surrounding opening 22 in surface 20b in contact with a surface to be printed. Groove 24 and opening 22 are separated by a thin separation wall 26. The top surface (bottom surface) of separation wall 26 is substantially flat and is flush with the rear surface 20b of mask plate 20.

Groove 24 is formed by half-etching. The depth D of groove 24 is not particularly limited. For the thickness of metal mask plate t, the depth D is determined to be about 0.5 t for example.

Groove 24 is formed close to and along the edge of opening 22. The distance between opening 22 and groove 24, in other words the width A of separation wall 26, is preferably as thin as possible for the purpose of improving printing quality. The width A is, however, not particularly limited. The width A is not necessarily uniform entirely around opening 22. The width W of groove 24 does not have particular limitation either, and width W is not necessarily uniform entirely around opening 22.

Figure 3:
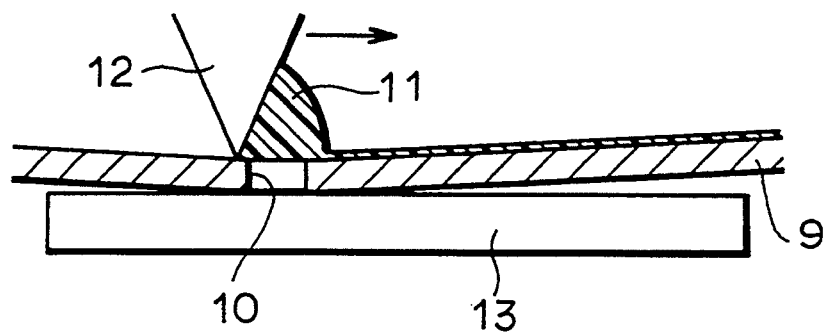
FIG. 3 is a partially enlarged vertical sectional view illustrating how screen printing is performed utilizing a conventional metal mask plate.
Figure 4:
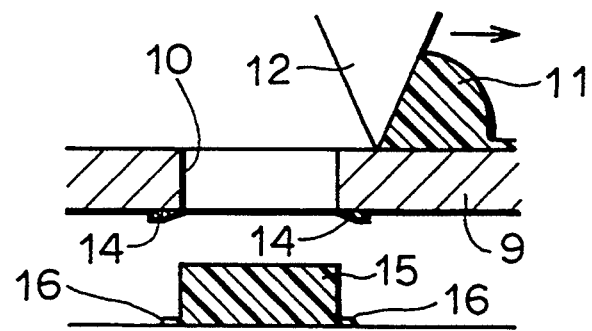
FIG. 4 is a partially enlarged vertical sectional view for use in illustration of problems associated with screen printing utilizing a conventional metal mask plate.
Figure 7:
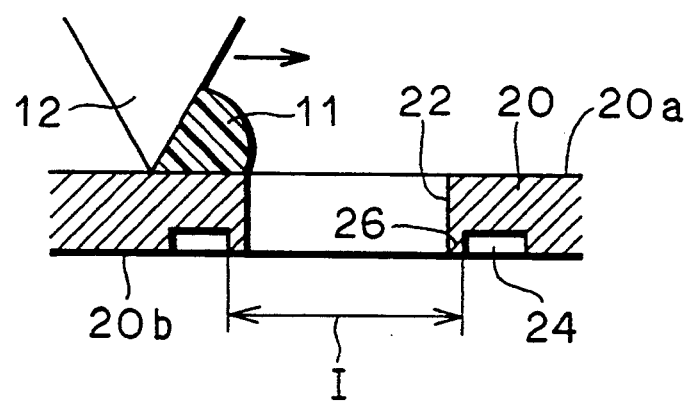
FIG. 7 is a partially enlarged vertical sectional view for use in illustration of the function of the metal mask plate shown in FIGS. 5 and 6.

Consider that screen printing is performed as illustrated in FIG. 7 utilizing a metal mask plate as shown in FIGS. 5 and 6. While being in contact with the surface 20a of metal mask plate 20, a squeegee 12 is made to slide across surface 20a in the direction indicated by the arrow. Solder paste 11 placed on front surface 20a of metal mask plate 20 is squeezed out to rear surface 20b through opening 22, and transferred onto the surface of a printed board (not shown). At this time, the solder paste partially comes to the rear surface 20b of metal mask plate 20, and the oozing of the paste from the edge of opening 22 occurs as illustrated in FIG. 4. The amount of oozing ink is different between printings so that, if a number of boards are consecutively printed without cleaning the metal mask, printing quality is not constant.

In contrast, metal mask plate 20 according to the invention solves such a conventional problem as follows. Referring to FIG. 7, assume that part of solder paste comes around to rear surface 20b to ooze from the edge of opening 22 to its periphery. The flowing of the paste is restricted by groove 24. The paste does not ooze beyond the position of the outer edge of separation wall 26. The amount of the paste oozing from the edge of opening 22 is thus made constant. The printing size of the solder paste transferred onto the printed board surface is the distance between the outer edges of both separation walls 26, 26, and therefore is always constant. Accordingly, the number of boards which can be printed consecutively without cleaning the rear surface of metal mask plate 26 is greatly increased as compared to a conventional screen printing plate.

Figure 8:
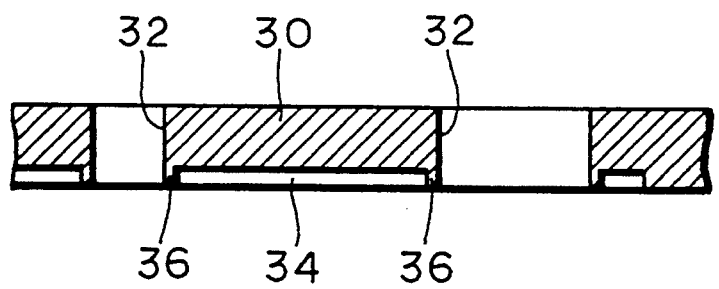
FIG. 8 is a partially enlarged vertical sectional view showing a variation of the metal mask plate in FIG. 5. This is constructed according to the first embodiment of the invention.

Referring to FIG. 5, as described above, there is not any limitation to the width W of grooves 24. Accordingly, a variation as shown in FIG. 8 is possible. Referring to FIG. 8, in a metal mask plate 30 according to this alternative embodiment, a groove (recess) 34 is formed entirely over the non-opening portion between adjacent openings 32, 32. Groove 34 is separated from openings 32, 32 by a separation wall 36. More specifically, separation wall 36 is formed along the edges of openings 32, 32.

Figure 9:
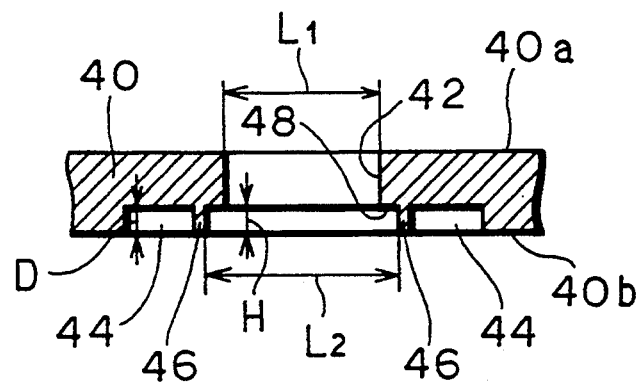
FIG. 9 is a partially enlarged vertical sectional view showing a metal mask plate constructed according to a second embodiment of the invention.

A metal mask plate 40 shown in FIG. 9 represents a second embodiment of the invention. Referring to FIG. 9, metal mask plate 40 has a front surface 40a, a rear surface 40b, and an opening 42 formed according to a pattern. The cross sectional area of the part of opening 42 on the side of rear surface 40b is made larger than the cross sectional area of the other part along the depth H to form a stepped portion 48. More specifically, the opening length L1 of opening 42 on the side of front surface 40a is different from the opening length L2 on the side of rear surface 40b, e.g., L1<L2. A groove 44 having a depth D is formed around the opening 42 of rear surface 40b. Groove 44 is separated from opening 42 by a separation wall 46.

Also in metal mask plate 40 according to the second embodiment, the flowing of solder paste from opening 42 onto the surrounding rear surface 40b is restricted by groove 44. More specifically, the solder paste oozing from opening 42 along its periphery is stopped at the position of the outer edge of separation wall 46. Accordingly, the amount of the solder paster oozing is made constant.

It is noted that although L1<L2 holds in FIG. 9, L1>L2 is possible. Also in FIG. 9, the depth D of groove 44 is drawn substantially equal to the depth (height) H of stepped portion 48. However, D and H do not have to have the same length.

Figure 10:
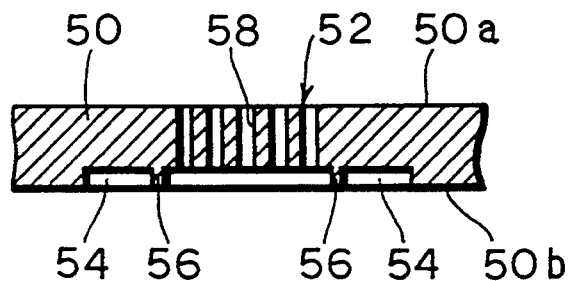
FIG. 10 is partially enlarged vertical sectional view showing a metal mask plate constructed according to a third embodiment of the invention.

FIG. 10 shows a third embodiment of the invention, wherein metal mask plate 50 has a front surface 50a and a rear surface 50b. Metal mask plate 50 further has a mesh-like opening 52 formed by a plurality of fine through holes 58. The side of rear surface 50b at opening 52 has a single depression, and its periphery is defined by the inner wall of a separation wall 56. A groove 54 is formed in rear surface 50b around opening 52. Groove 54 and opening 52 are separated from each other by separation wall 56.

Also in metal mask plate 50 according to the embodiment shown in FIG. 10, the oozing of solder paste from opening 52 along its periphery at rear surface 50b is restricted by groove 54. The solder paste will not ooze beyond the outer edge of separation wall 56, and therefore the amount of the solder paste that oozes is made constant.

Figure 11:
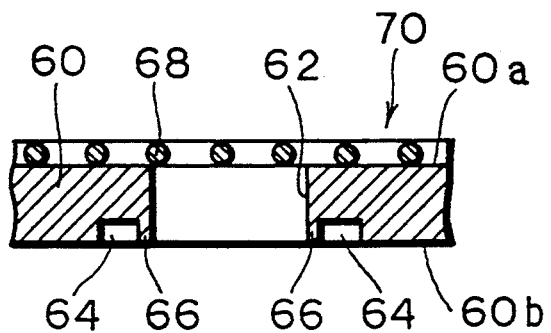
FIG. 11 is a partially enlarged vertical sectional view showing a metal mask plate constructed according to a fourth embodiment of the invention.

FIG. 11 illustrates a fourth embodiment of the invention, wherein metal mask plate 70 includes a member 60 forming a metal mask having a similar structure to metal mask plate 20 shown in FIGS. 5–7, and a member 68 forming a mesh. Members 60 and 68 may be integrally formed by means of plating.

Referring to FIG. 11, member 60 has a front surface 60a and a rear surface 60b. Member 68 is formed on front surface 60a. Member 60 further has an opening 62 formed according to a preselected pattern. A groove 64 is formed surrounding opening 62 around opening 62 on the side of rear surface 60b. Opening 62 and groove 64 are separated from each other by a separation wall 66 provided therebetween.

Also in the metal mask plate 70 according to the embodiment shown in FIG. 11, the oozing of the solder paste from opening 62 along its periphery at rear surface 60b is restricted by groove 64. The solder paste stops within the narrow lower end surface of separation walls 66 and will not ooze beyond the outer edge, so that the amount of the solder paste oozing is made constant.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A screen printing plate including a plate body having first and second main surfaces, wherein
   said plate body has a plurality of openings penetrating from said first main surface to said second main surface to form a preselected pattern,
   a recess associated with an surrounding each of said openings on said second main surface of said plate body, said recesses extending from said second main surface only part way toward said first main surface and having no opening to said first main surface, and
   a separation wall defining a boundary between each of said opening and its associated recess.

2. A screen printing plate as recited in claim 1, wherein said separation wall has an inner wall defining the circumference of said one opening, an outer wall defining the internal circumferential wall of said recess, and a top surface linking said internal wall and said outer wall.

3. A screen printing plate as recited in claim 2, wherein said top surface is substantially flat.

4. A screen printing plate as recited in claim 3, wherein said top surface is flush with said second main surface.

5. A screen printing plate as recited in claim 1, wherein said opening is formed so that the area of said opening on said first main surface is different from the area of said opening on said second main surface.

6. A screen printing plate as recited in claim 5, wherein said opening is formed so that the area of said opening on said first main surface is smaller than the area of said opening on said second main surface.

7. A screen printing plate as recited in claim 1, wherein said recess extends substantially entirely along the region of first and second adjacent ones of said openings on said second main surface, separated from said first opening by said first separation wall and separated from said second opening by a second separation wall.

8. A screen printing plate as recited in claim 7, wherein said first separation wall has an internal wall defining the circumference of said first opening, an outer wall defining the internal circumferential wall of said recess, and a top surface linking said internal wall and said outer wall.

9. A screen printing plate as recited in claim 8, wherein said top surface is substantially flat.

10. A screen printing plate as recited in claim 9, wherein said top surface is flush with said second main surface.

11. A screen printing plate as recited in claim 1, wherein said recess is formed to surround a region on said second main surface in which a plurality of said openings are formed, said plurality of openings surrounded by said recess are separated from said recess by said separation wall formed around the region in which said plurality of openings are formed.

12. A screen printing plate as recited in claim 11, wherein said predetermined separation wall has an internal wall defining the circumference of said one opening, an outer wall defining the internal circumferential wall of said recess, and a top surface linking said internal wall and said outer wall.

13. A screen printing plate as recited in claim 12, wherein said top surface is substantially flat.

14. A screen printing plate as recited in claim 13, wherein said top surface is flush with said second main surface.

15. A screen printing plate as recited in claim 12, wherein said plurality of openings surrounded by said recess are formed to communicate with each other on the side of said second main surface.

16. A screen printing plate as recited in claim 1, further comprising a mesh member joined to said plate body at said first surface and having a plurality of openings.

17. A screen printing plate as recited in claim 16, wherein said mesh member is formed integrally with said plate body.

18. A screen printing plate as recited in claim 1, wherein the shape of the circumference of each said opening on said second surface is rectangular.

* * * * *